United States Patent
Altman et al.

(10) Patent No.: US 9,526,192 B2
(45) Date of Patent: Dec. 20, 2016

(54) COLD CHASSIS FOR ELECTRONIC MODULES AND METHOD OF MAKING SAME

(71) Applicant: Raytheon Company, Waltham, MA (US)

(72) Inventors: David H. Altman, Framingham, MA (US); Scott R. Cheyne, Brookline, MA (US); Anurag Gupta, Canton, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/492,818

(22) Filed: Sep. 22, 2014

(65) Prior Publication Data

US 2015/0013939 A1  Jan. 15, 2015

Related U.S. Application Data

(62) Division of application No. 12/590,865, filed on Nov. 16, 2009, now Pat. No. 8,839,519.

(51) Int. Cl.
| | |
|---|---|
| *F28F 3/02* | (2006.01) |
| *H05K 7/20* | (2006.01) |
| *F28F 3/12* | (2006.01) |
| *F28D 15/02* | (2006.01) |
| *F28D 21/00* | (2006.01) |

(Continued)

(52) U.S. Cl.
CPC ............ *H05K 7/20418* (2013.01); *F28F 3/12* (2013.01); *H05K 7/2029* (2013.01); *H05K 7/20636* (2013.01); *H05K 7/20645* (2013.01); *F28D 15/0266* (2013.01); *F28D 2021/0029* (2013.01); *F28F 3/02* (2013.01); *F28F 9/02* (2013.01); *F28F 2260/02* (2013.01); *F28F 2275/04* (2013.01); *F28F 2275/062* (2013.01); *H01L 23/473* (2013.01); *H01L 2924/0002* (2013.01); *Y10T 29/4935* (2015.01); *Y10T 29/49359* (2015.01); *Y10T 29/49366* (2015.01); *Y10T 29/49369* (2015.01); *Y10T 29/49373* (2015.01)

(58) Field of Classification Search
CPC ............. H05K 7/20418; H05K 7/2029; H05K 7/20645; H05K 7/20636; F28F 3/12; F28F 2260/02; Y10T 29/49366; Y10T 29/4935; Y10T 29/49369; Y10T 29/49359; Y10T 29/49373; H01L 2924/0002; F28D 15/0266; F28D 2021/0029
See application file for complete search history.

(56) References Cited

U.S. PATENT DOCUMENTS

| | | | |
|---|---|---|---|
| 4,947,931 A | * | 8/1990 | Vitacco ........................ 165/148 |
| 4,962,444 A | | 10/1990 | Niggemann |
| 6,129,145 A | | 10/2000 | Yamamoto et al. |

(Continued)

OTHER PUBLICATIONS

Written Opinion of the International Searching Authority dated Dec. 16, 2010 in connection with International Patent Application No. PCT/US2010/002742.

*Primary Examiner* — Richard Chang

(57) ABSTRACT

A cold chassis and method of making a cold chassis for electronic modules featuring the fabrication of individual brazed cooling ribs each including microchannels along the length thereof and a peripheral flange. A set of adjacent ribs are secured together and assembled onto at least one face of a frame member. The rib flanges are sealed (e.g., friction stir welded) with respect to the frame member.

20 Claims, 9 Drawing Sheets

(51) Int. Cl.
  *F28F 9/02*    (2006.01)
  *H01L 23/473*  (2006.01)

(56) References Cited

U.S. PATENT DOCUMENTS

| | | |
|---|---|---|
| 6,536,516 B2 * | 3/2003 | Davies ................... F02M 31/20 |
| | | 165/170 |
| 7,156,159 B2 | 1/2007 | Lovette et al. |
| 8,596,339 B2 * | 12/2013 | Palanchon ......... F02M 25/0737 |
| | | 165/103 |
| 2001/0055714 A1 | 12/2001 | Cettour-Rose et al. |
| 2003/0152488 A1 | 8/2003 | Tonkovich et al. |
| 2004/0066625 A1 | 4/2004 | Meyer et al. |
| 2004/0099712 A1 | 5/2004 | Tonkovich et al. |
| 2005/0199372 A1 | 9/2005 | Frazer et al. |
| 2008/0040926 A1 | 2/2008 | Kismarton et al. |
| 2009/0065177 A1 | 3/2009 | Ouyang |

* cited by examiner

COLD CHASSIS FOR ELECTRONIC MODULES AND METHOD OF MAKING SAME

CROSS-REFERENCE TO RELATED APPLICATIONS

This application is a divisional of U.S. patent application Ser. No. 12/590,865 filed on Nov. 16, 2009, which issued on Sep. 23, 2014 as U.S. Pat. No. 8,839,519. Application Ser. No. 12/590,865 is hereby incorporated by reference in its entirety.

FIELD OF THE INVENTION

The subject invention relates primarily to heat sinks and, in particular, edge cooling of electronic modules.

BACKGROUND OF THE INVENTION

Electronic modules residing in a chassis or cabinet or other higher level assembly or system are often "edge cooled." The typical electronic module includes a printed circuit board populated with electronic components. U.S. Pat. No. 4,962,444, for example, discloses a cold chassis including a frame with spaced ribs. Electronic modules are placed between the ribs. Coolant flows in the frame and ribs to cool the electronic modules. U.S. Published Patent Application No. 2005/0199372 discloses a cooling rib with machined cooling fins therein. Both of these references are incorporated herein by this reference.

In some cases, a radar system is one example, the equipment chassis is already designed and/or in place but higher power electronic modules (e.g., transmit/receive integrated microwave modules or TRIMMs) are to be installed. Changing the overall system architecture to include increased cooling for such modules may be expensive and thus undesirable.

Microchannel heat sinks are also known and, in one example, folded fins are inserted into a body and then brazing methods are used to secure the fins in place. During brazing, however, the microchannels formed by the fins can become clogged resulting in low yields. In addition, brazing autoclaves are limited in size. Brazing larger size heat sinks is expensive due to the limited availability of suppliers who have large brazing autoclaves and associated equipment.

Prior attempts to implement high-performance cooling schemes for edge-cooled electronic assemblies have had limited impact due to fundamental thermal physical and mechanical constraints preventing implementation on the scale necessary for edge cooling high power electronic systems. One thermal physical constraint includes the ability to fit the necessary volumetric flow of coolant into a constrained geometry and/or excessive temperature rises and pressure drops. An example of a mechanical constraint includes designs which cannot be easily scaled and/or manufactured. Many edge-cooled electronic systems are large and constitute many square meters which must be cooled. Practical large-scale solutions involving high performance cooling techniques such as the use of microchannels have proven elusive.

BRIEF SUMMARY OF THE INVENTION

The invention, in one aspect, features the use of cooling ribs with microchannels therein in combination with a phase change coolant to provide an increased heat transfer coefficient and also isothermal cooling. One preferred version of the cooling ribs enables them to be individually tested after brazing. Thereafter, welding, (e.g., friction stir welding) techniques are used to secure the ribs to a frame member constructed to supply the phase change coolant to the individual cooling ribs. Large scale manufacturability is possible.

Featured are methods of making a cold chassis for electronic modules. One preferred method includes fabricating individual cooling ribs, typically brazed ribs each including microchannels along the length thereof. Each rib also preferably includes a peripheral flange. A plurality of adjacent ribs may first be secured together. The plurality of joined ribs are assembled onto at least one face of a frame member. The rib flanges are then sealed with respect to the frame member typically by friction stir welding.

The method may further include the step of forming, in at least one face of the frame member, a supply header spaced from a return header. The supply header and the return header are typically depressions machined in the face of the frame member. The preferred method further includes the step of forming (e.g., machining) patterned recesses in the face of the frame member. The recesses correspond to the ribs. The pattern recesses may include a ledge portion proximate the supply header and the return header.

Typically, adjacent flanges of the ribs are conjoined at locations corresponding to the supply and return headers in the frame member. A supply port can be added to the conjoined ribs corresponding to the location of the supply header and a return port can be added to the conjoined ribs corresponding to the location of the return header.

Fabricating each rib may include forming a proximal inlet port in fluid communication with a distal outlet port. Typically, a phase change coolant is introduced to the supply port to flow into the supply header and then into the inlet ports of the plurality of ribs and through the rib microchannels. The coolant exits out the outlet port of the ribs, into the return header, and out the return port.

The ribs may be machined if necessary, after they are sealed to the frame member and/or tested after fabrication but before they are assembled onto the frame member.

One cold chassis according to the invention features a frame member including patterned adjacent recesses, and a plurality of cooling ribs on the frame member. A seal secures peripheral flanges of each rib in recesses in the frame member. The preferred seal is attained via a friction stir weld.

Typically, each rib includes microchannels along the length thereof. One example of a frame member includes a proximal supply header and a distal return header and each rib then includes a proximal bottom side inlet port in fluid communication with the supply header and a distal bottom side outlet port in fluid communication with the return header. There may also be at least one supply port in fluid communication with the supply header and at least one return port in fluid communication with the return header. A phase change coolant flows through the supply port into the supply header and into the inlet ports of the ribs, through the ribs to the outlet ports thereof, into the return header, and then exiting via the return port.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1A:
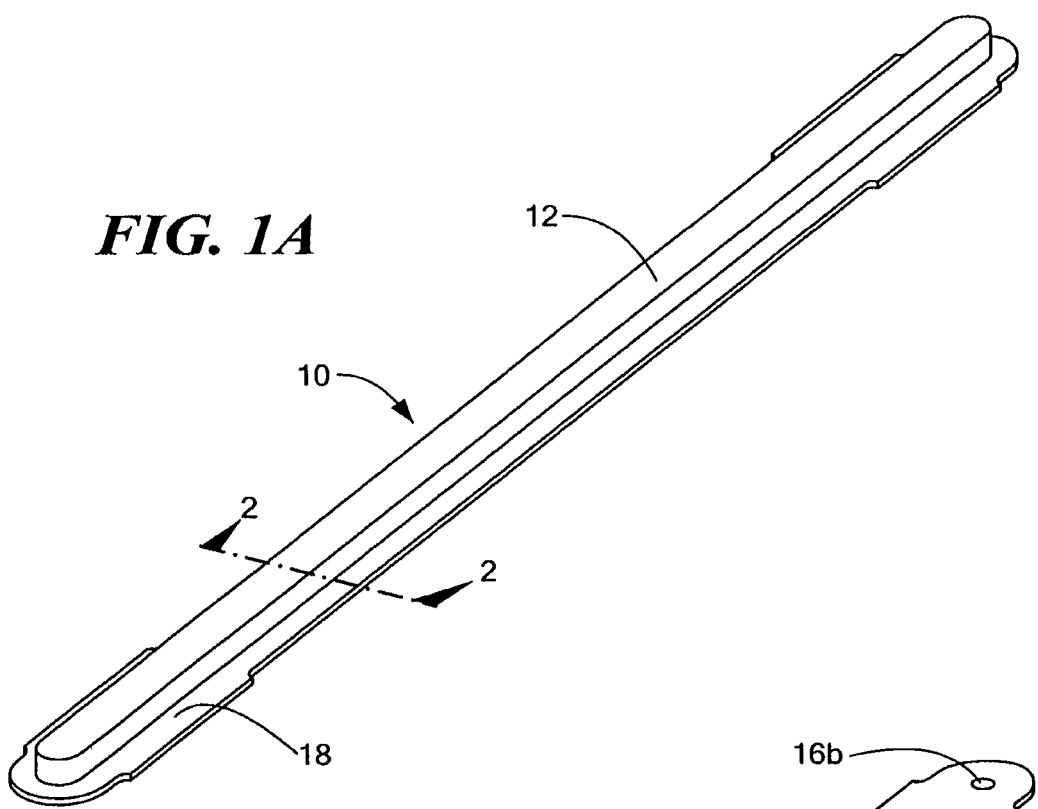
FIG. 1A is a schematic three-dimensional top view of an example of an individual cooling rib in accordance with the invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1B:
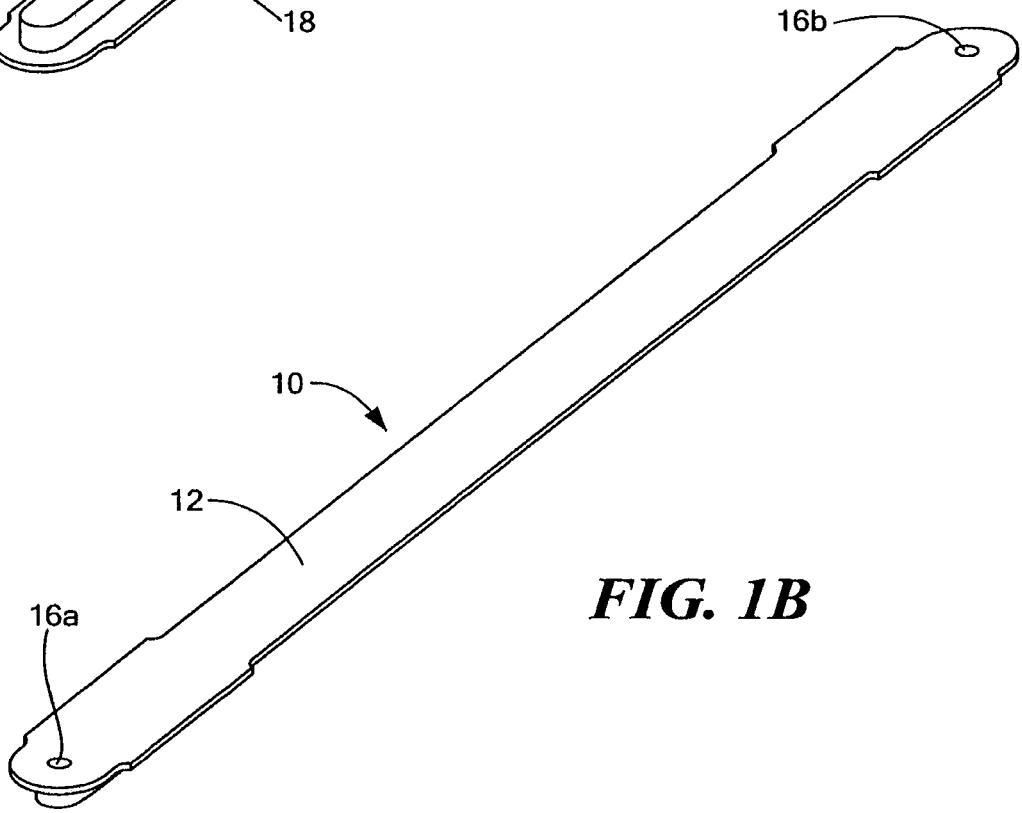
FIG. 1B is a bottom view of the cooling rib shown in FIG. 1.
Figure 2:
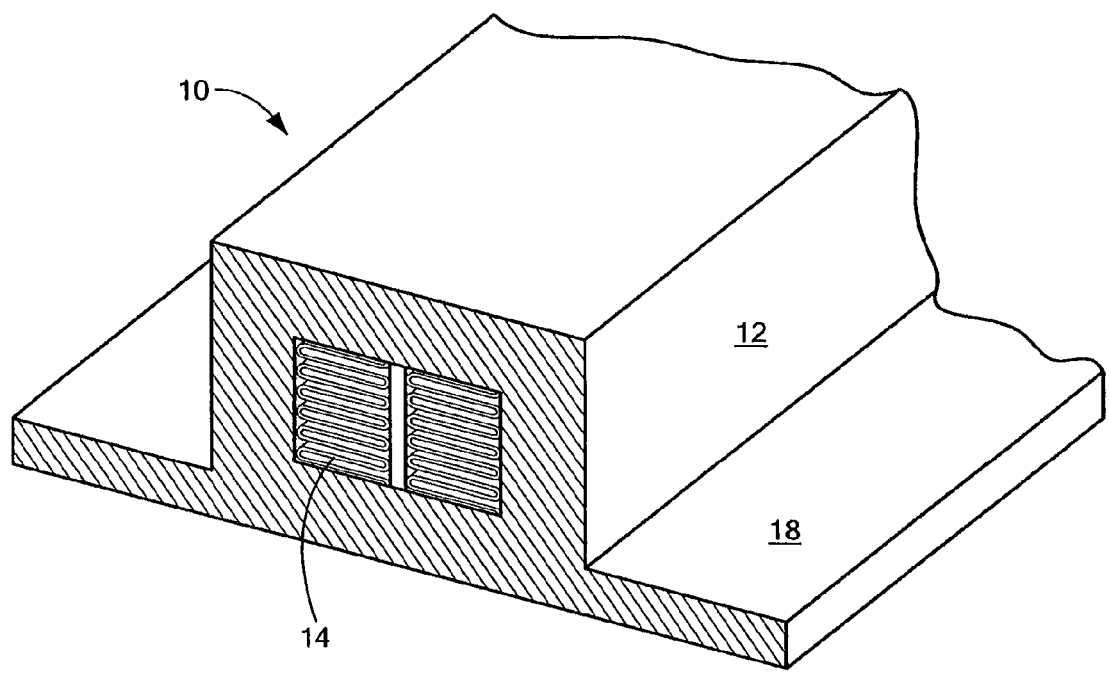
FIG. 2 is a schematic cross-sectional view of the rib shown in FIG. 1A taken along line 2-2.

FIGS. 1A-1B show an example of a brazed cooling rib 10 including a lengthy member 12 made of, for example, aluminum. The rib preferably includes microchannels along its length. In this particular example, the microchannels are formed via microfins 14, FIG. 2 within the rib extending along the length of member 12 between inlet port 16a, FIG. 1B and outlet port 16b on the bottom of the rib. The microfins may also be made of aluminum. In one preferred design, rib 10 includes peripheral flange 18. Typically, a plurality of these ribs are fabricated using brazing methods to secure microfins 14 in member 12. Brazing methods may result in the clogging of the microfins in some cases but fabricating the ribs in this way allows them to be individually pressure and/or flow tested before the next step in the method where the ribs are incorporated into a higher level assembly. Only ribs which pass the test(s) are then used.

Figure 3A:
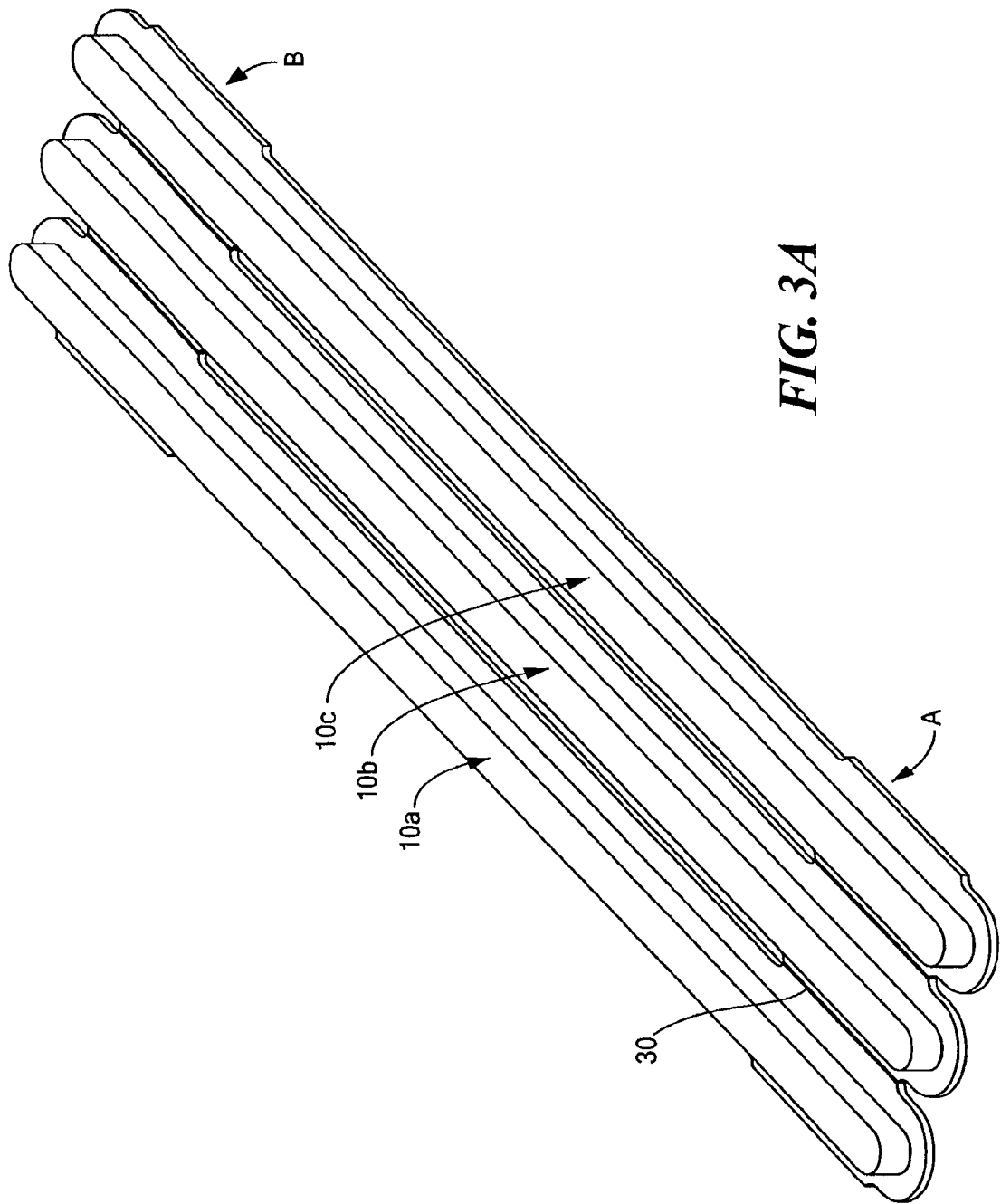
FIG. 3A is a schematic three-dimensional top view showing a plurality of individual cooling ribs joined together in accordance with an example of the method of the invention.
Figure 3B:
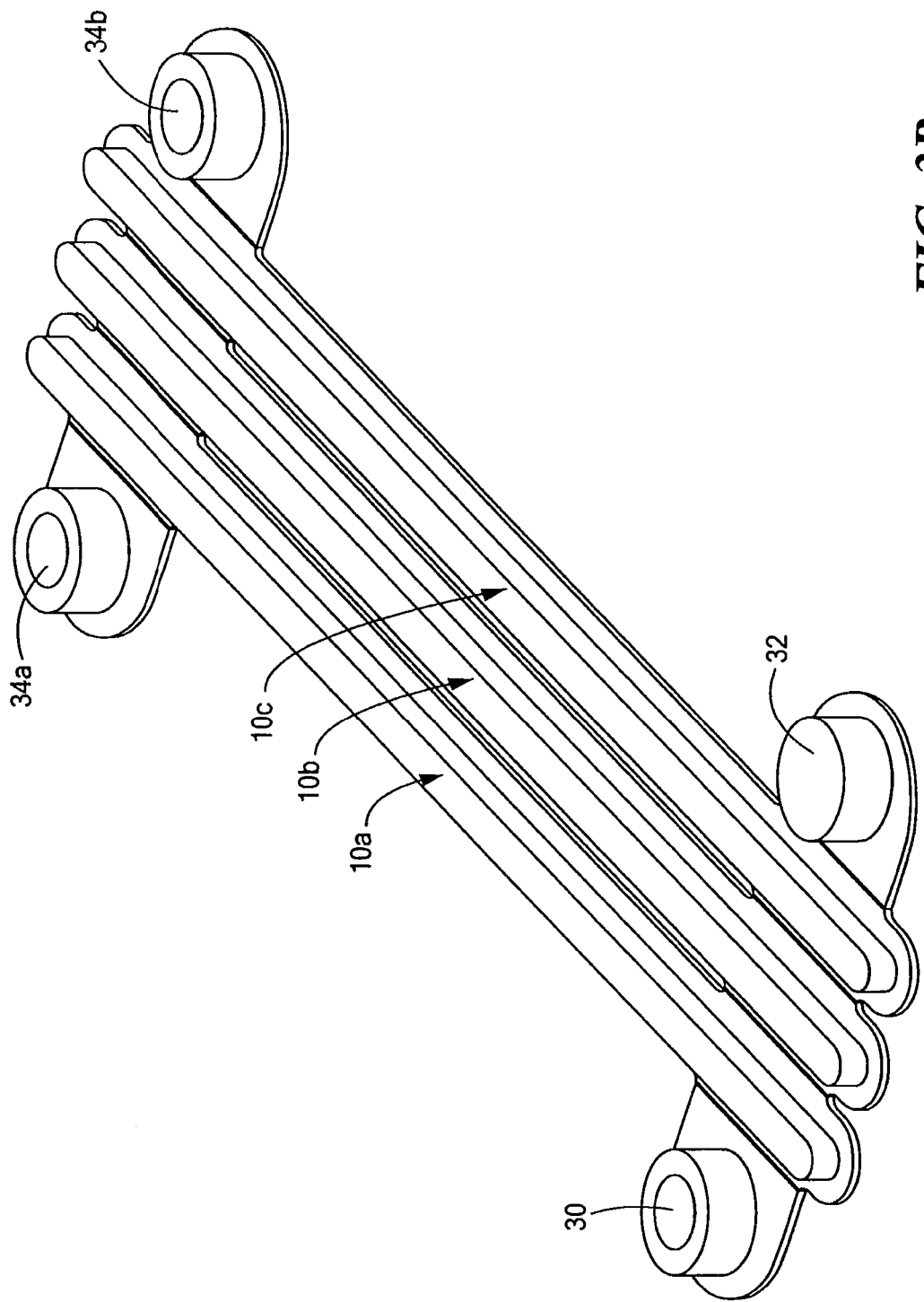
FIG. 3B is a schematic three-dimensional top view showing an example where coolant supply and return ports are added to the conjoined ribs.

FIG. 3A shows a plurality of these ribs 10a, 10b, and 10c secured together so that they lie adjacent to each other typically in a parallel arrangement. The lengthy slot between adjacent ribs will accommodate an edge, typically one side, of an electronic module. The number of ribs will vary depending upon the design of the chassis, the number of modules, and the like. In one preferred method, the flanges of ribs 10a-10c are friction stir welded at locations A and B which typically correspond to the locations of supply header 20, FIG. 4 and return header 22, respectively, machined in one or both faces' of frame member 24. A friction stir weld is shown, for example, at 30 in FIG. 3A between the flanges of ribs 10a and 10b at location A. A fixture, not shown, may be used to align and support the ribs during the friction stir welding process. The ribs are secured or conjoined together in this example at locations A and B because the force used in the friction stir welding process might bend the ribs at locations A and B if they were first placed over supply header 20 and return header 22, FIG. 4. FIG. 3B shows a design where supply port member 30, end cap member 32, and return port members 34a and 34b are also added to rib assembly typically also by employing friction stir welding techniques.

Figure 4:
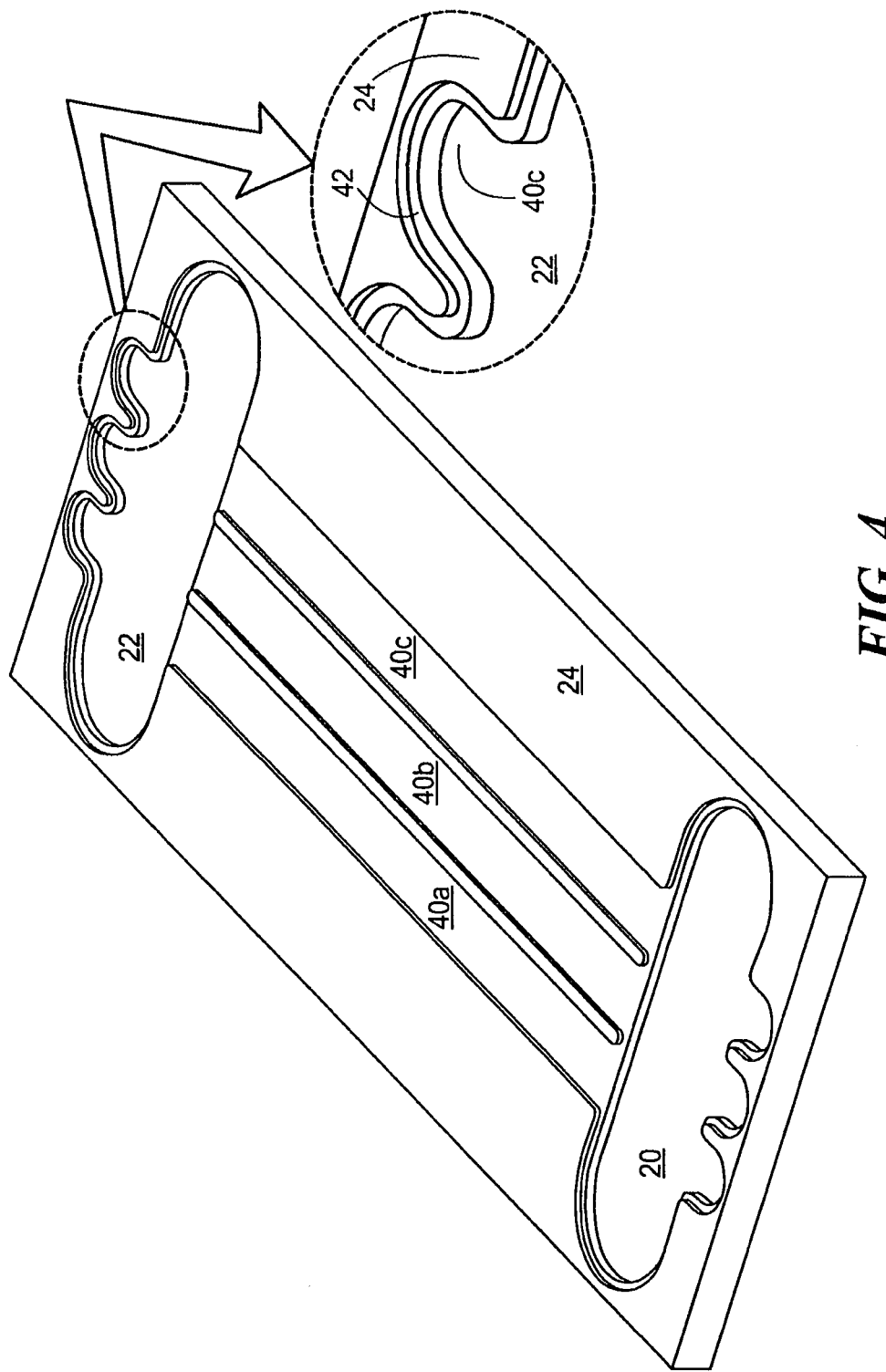
FIG. 4 is a schematic three-dimensional view showing one face of a frame member for the cooling ribs in accordance with an example of the invention.

At some point in the process, patterned recesses 40a, 40b and 40c, FIG. 4 are formed (e.g., machined) in one or both faces of frame member 24. There is typically one recess for each rib and the recesses, like the ribs, run in a parallel relationship along the extent of frame member 24. A spaced pair of such frame members are typically used to support a number of edge cooled electronic modules. As shown for recess 40c, each recess includes a peripheral ledge 42 in which sits the peripheral flange of rib 10c, FIGS. 5-6 at the supply and return header areas of the frame member. Frame member 24 may also be made of aluminum.

Figure 5:
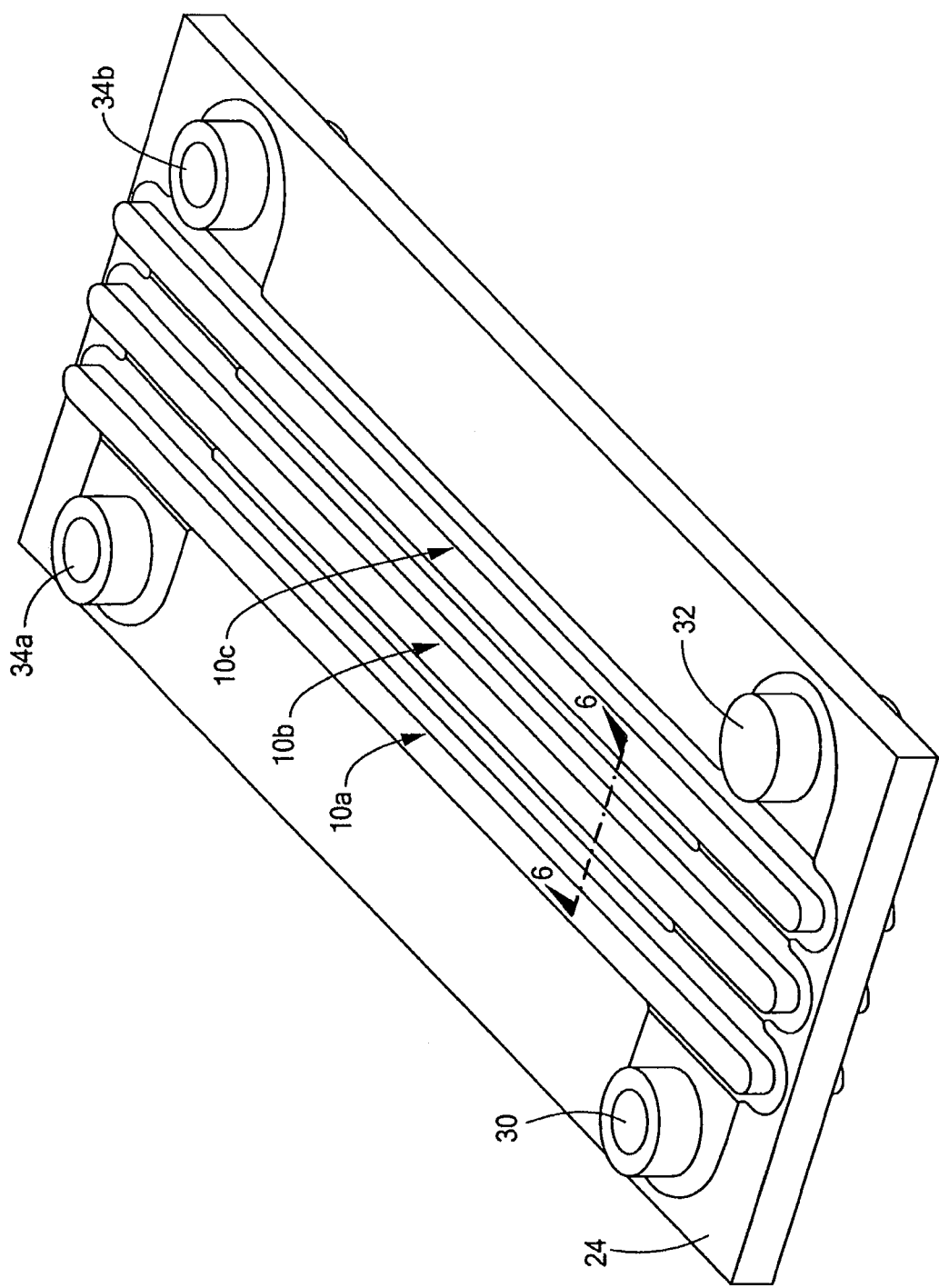
FIG. 5 is a schematic three-dimensional top view showing how the conjoined ribs are assembled on to the frame member and sealed with respect thereto.
Figure 6:
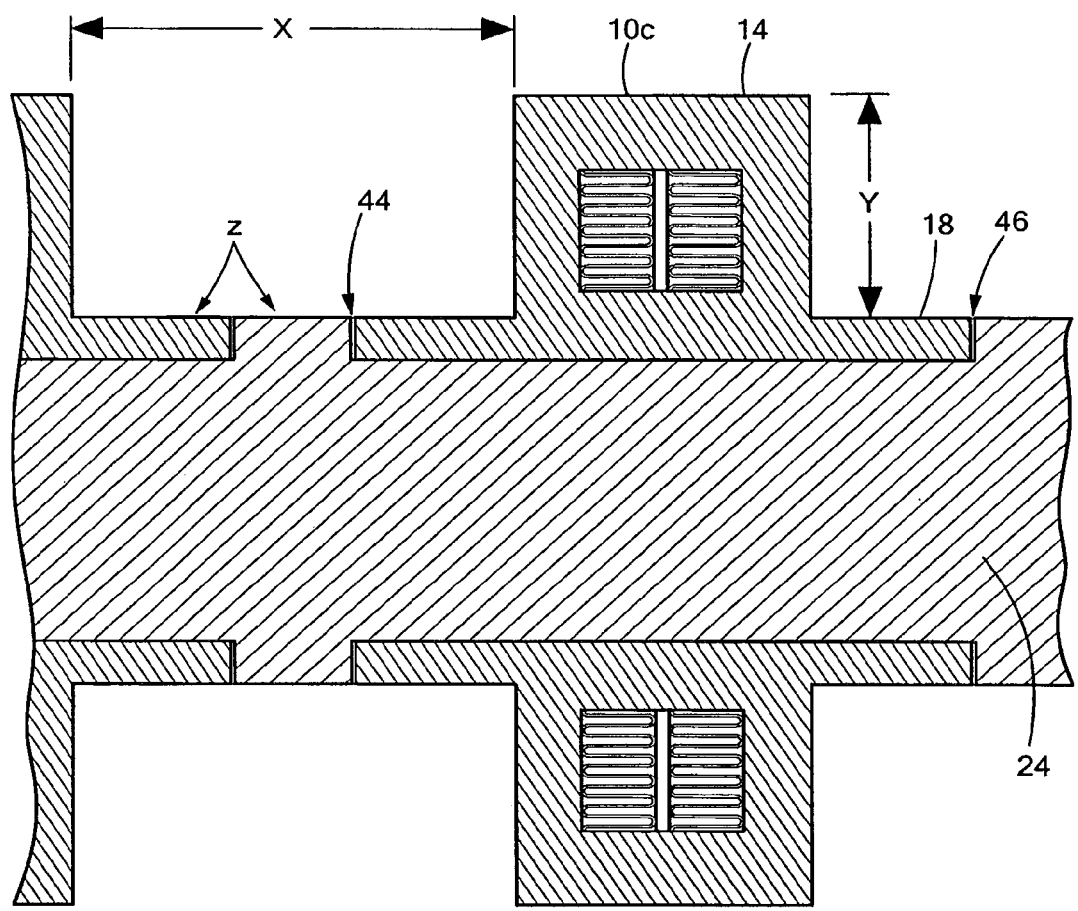
FIG. 6 is a schematic cross-sectional view of a portion of the assembly shown in FIG. 5.

After the conjoined ribs have been assembled onto the frame member 24 as shown in FIG. 5, the rib flanges are sealed to the frame member again preferably using friction stir welding techniques (except at locations A and B, FIG. 3A above the supply and return headers, FIG. 4, where the ribs are already conjoined together). FIGS. 5 and 6 also show rib members on the opposite face of frame member 24 which is common. Thus, there is a friction stir weld at locations 44 and 46 in FIG. 6, i.e., about the entire periphery of the rib flange. If needed, the entire assembly can then be machined especially if the application demands very tight tolerances of the pitch from rib to rib (distance X in FIG. 6), rib height (Y), or co-planarity (Z).

Figure 7:
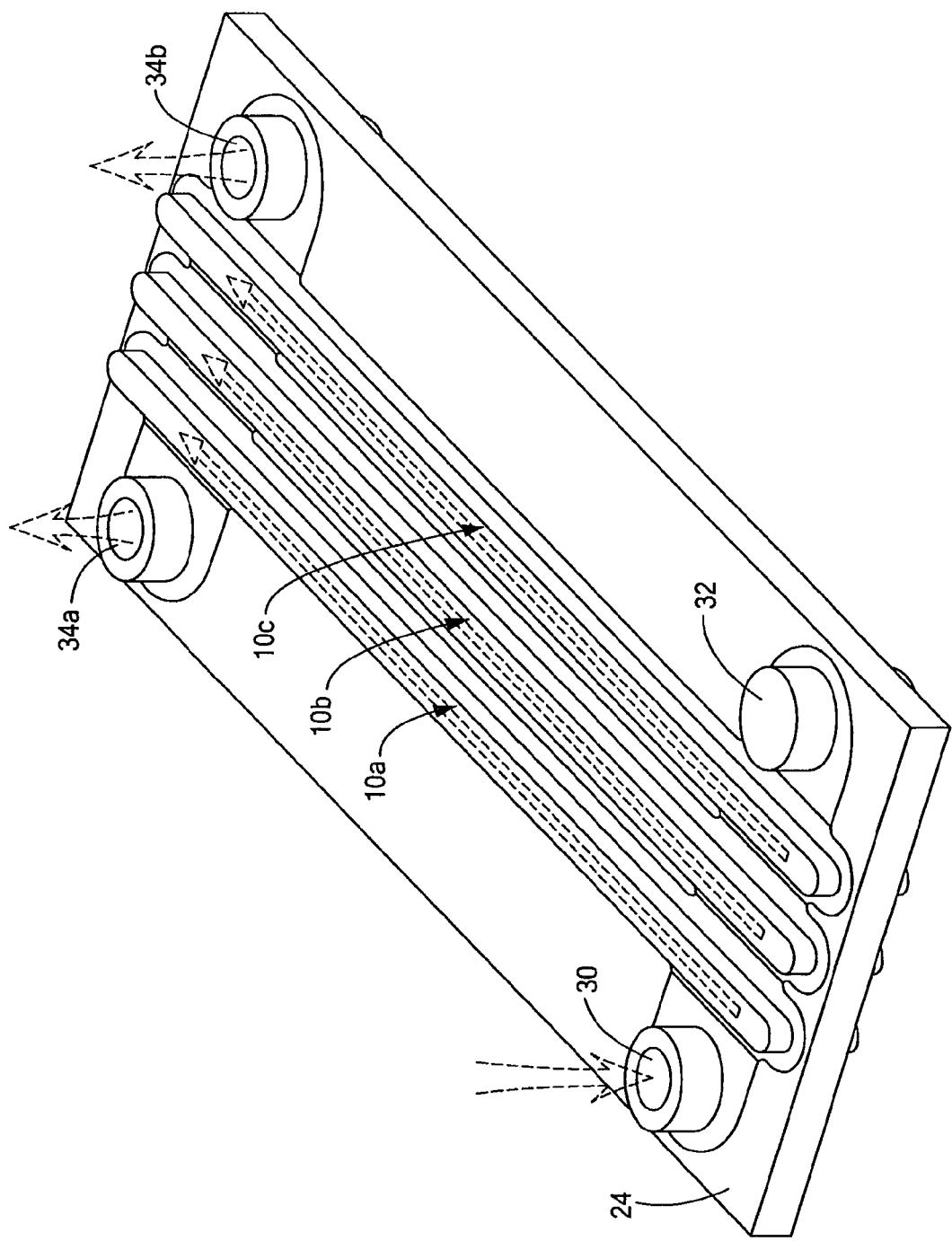
FIG. 7 is a schematic three-dimensional top view similar to FIG. 5 showing the flow of a phase change coolant through the assembly.
Figure 8:
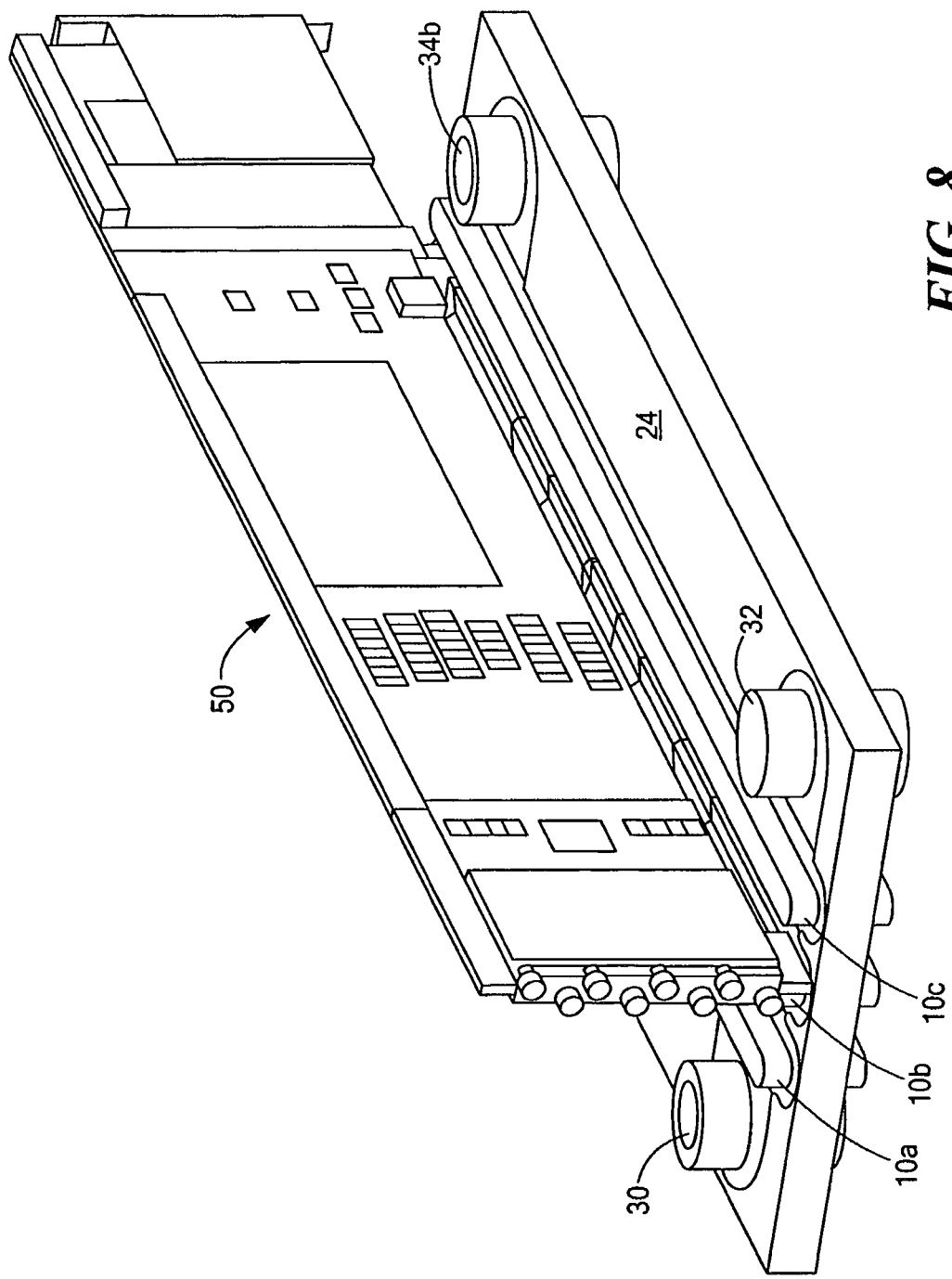
FIG. 8 is a schematic three-dimensional front view showing an electronic module disposed between adjacent cooling ribs in accordance with the invention.

In this specific design, a phase change coolant is introduced via supply port 30, FIG. 7 and flows into supply header 20, FIG. 4 and then into the inlets (see inlet port 16a, FIG. 1B) of ribs 10a-10c. As the phase change coolant flows through the microchannels of the ribs, it edge cools electronic modules supported between the ribs. FIG. 8 shows electronic module 50 (e.g., a TRIMM) held in place between ribs 10a and 10b via one or more wedge locks. The wedge lock applies force to the edge of the heat dissipating electronic assembly to enhance thermal contact with the ribs. A similar cooling manifold is usually fabricated for the other edge of electronic assembly 50, FIG. 8. The coolant then exits the outlet ports of the ribs (see outlet port 16b, FIG. 1B) and flows into return header 22, FIG. 4 and then out return ports 34a and 34b, FIGS. 5 and 7-8. The conduits, plenums, valving, and the like at the chassis level for coolant supply and return is not shown.

The typical manufacturing process involves fabricating brazed rib assemblies with microfin density and locations appropriate for the thermal load to be addressed. The size of the rib flange can be adjusted to achieve the proper friction stir weld at the next higher assembly. A fixture may be used to properly align a plurality of the rib assemblies and to physically connect the ribs together at the edge flanges again using friction stir welding as discussed above with reference to FIGS. 3A and 3B. Traditional welding, epoxy, and other techniques, however, may be used. The frame member is machined to create a coolant supply and coolant return headers that will feed the rib assembly in parallel. One or both sides of the frame member may be machined. The entire periphery of the conjoined rib assembly is then friction stir welded to the frame member. This creates a water tight seal and a structural joint around the perimeter of each rib flange.

This scalable method for parallel cooling of edge cooled electronic assemblies using modular microchannel rib members can be configured to fit an existing mechanical envelope while at the same time providing significantly improved cooling capabilities. The high density brazed folded fin configuration is preferably used to obtain the heat transfer and pressure drop characteristics required for thermal isolation over large distances (typically, many meters). The configuration of brazed folded fin 14, FIG. 2 can be selected to obtain isothermal rib performance at a specified flow rate. Indeed, varying fin pitches can be used to achieve varying cooling performance along the length of the rib. For example, if certain areas of electronic module 50, FIG. 8 generate more heat than other areas, the configuration of the fin pitches in the cooling ribs can be tailored accordingly. The size of the microchannels along the length of the ribs may thus vary.

In one preferred embodiment, the inventive method takes advantage of novel combinations of multi-scaled manufacturing processes to achieve increased heat transfer performance, thermal isolation, and a flow distribution control desired to realize cost-effective high-performance edge cooling over many square meters. The parallel distribution of a phase change coolant in the modular microchannel ribs provides an increase in performance relative to current known state of the art approaches. The result is an increase in the power density for edge-cooled electronic assemblies without a corresponding increase in cold plate temperature within the same form factor. The use of a phase change coolant also increases the heat transfer rate to the modular microchannel rib assemblies and results in a constant rib temperature. This allows the heat to preferentially flow into the ribs instead of the supply and return headers to achieve the required thermal isolation. Existing electronic assemblies can be backfit with the edge cooling subassembly shown in FIG. 8. Finally, each rib can be independently flow and pressure tested before it is permanently attached to the next higher assembly. The smaller scale brazement also permits many more suppliers to produce the individual ribs further reducing costs and improving yield at final assembly.

Thus, although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A cold chassis comprising:
    a frame member including multiple patterned adjacent recesses, each recess having a substantially planar portion;
    multiple cooling ribs secured to the frame member, each cooling rib including a peripheral flange and a substantially planar surface, the peripheral flange extending around a circumference of the cooling rib, a surface of the peripheral flange forming part of the substantially planar surface, each cooling rib at least partially disposed in an associated one of the recesses such that the substantially planar surface of the cooling rib contacts the substantially planar portion of the associated recess along at least a majority of a length of the cooling rib; and
    a seal securing the peripheral flange of each cooling rib in the associated recess;
    wherein each recess also has first and second ends opposite each other, each end comprising a peripheral ledge; and
    wherein a first portion of the peripheral flange of each cooling rib is configured to sit on the peripheral ledge of the first end of the associated recess and a second portion of the peripheral flange of each cooling rib is configured to sit on the peripheral ledge of the second end of the associated recess.

2. The cold chassis of claim 1, wherein the seal is a friction stir weld.

3. The cold chassis of claim 1, wherein each cooling rib further includes a plurality of microchannels that extend internally along a majority of the length of the cooling rib.

4. The cold chassis of claim 1, wherein the frame member further includes a proximal supply header and a distal return header.

5. The cold chassis of claim 4, wherein the headers are depressions in a face of the frame member.

6. The cold chassis of claim 4, wherein each cooling rib further includes:
    a proximal inlet port in the substantially planar surface, the proximal inlet port in fluid communication with the supply header; and
    a distal outlet port in the substantially planar surface, the distal outlet port in fluid communication with the return header.

7. The cold chassis of claim 6, further including:
    at least one supply port in fluid communication with the supply header; and
    at least one return port in fluid communication with the return header.

8. The cold chassis of claim 7, wherein the cold chassis is configured to flow a phase change coolant through the at least one supply port into the supply header and into the inlet ports of the cooling ribs, through the cooling ribs to the outlet ports thereof, into the return header, and then through the at least one return port.

9. A cold chassis comprising:
a frame member comprising multiple recesses in a face of the frame member, each recess having a substantially planar portion; and
multiple cooling ribs, each cooling rib having a substantially planar surface and a peripheral flange extending around a circumference of the cooling rib, a surface of the peripheral flange forming part of the substantially planar surface, the peripheral flange at least partially inserted into an associated one of the recesses and placed in thermal contact with the frame member such that the substantially planar surface of the cooling rib contacts the substantially planar portion of the associated recess along at least a majority of a length of the cooling rib;
wherein each recess also has first and second ends opposite each other, each end comprising a peripheral ledge; and
wherein a first portion of the peripheral flange of each cooling rib is configured to sit on the peripheral ledge of the first end of the associated recess and a second portion of the peripheral flange of each cooling rib is configured to sit on the peripheral ledge of the second end of the associated recess.

10. The cold chassis of claim 9, wherein the peripheral flange of each cooling rib is sealed to the frame member.

11. The cold chassis of claim 9, wherein the frame member further comprises a supply header and a return header in the face of the frame member, each header located between the opposite ends of the recesses such that the recesses extend through the each header.

12. The cold chassis of claim 11, wherein each cooling rib further comprises:
an inlet port in fluid communication with the supply header; and
an outlet port in fluid communication with the return header.

13. The cold chassis of claim 11, further comprising:
at least one supply port in fluid communication with the supply header; and
at least one return port in fluid communication with the return header.

14. The cold chassis of claim 9, wherein each cooling rib further comprises a plurality of microchannels that extend internally along a majority of the length of the cooling rib.

15. A cold chassis comprising:
a frame member comprising:
multiple recesses in a face of the frame member, each recess having a substantially planar portion, first and second ends of each recess opposite each other, each of the first and second ends comprising a peripheral ledges in a same plane as the substantially planar portion; and
a supply header and a return header in the face of the frame member, each header located between opposite ends of the recesses such that the recesses extend through the each header; and
multiple cooling ribs in thermal contact with the frame member, each cooling rib comprising:
a substantially planar surface;
a peripheral flange extending around a circumference of the cooling rib, a surface of the peripheral flange forming part of the substantially planar surface, the peripheral flange at least partially inserted into an associated one of the recesses and sitting on the peripheral ledges of the associated recess such that the substantially planar surface of the cooling rib contacts the substantially planar portion of the associated recess along at least a majority of a length of the cooling rib, wherein a first portion of the peripheral flange of the cooling rib is configured to sit on the peripheral ledge of the first end of the associated recess and a second portion of the peripheral flange of the cooling rib is configured to sit on the peripheral ledge of the second end of the associated recess;
an inlet port in fluid communication with the supply header; and
an outlet port in fluid communication with the return header.

16. The cold chassis of claim 15, wherein the peripheral flange of each cooling rib is sealed to the frame member.

17. The cold chassis of claim 16, wherein a seal between the peripheral flange of each cooling rib and the frame member is a friction stir weld.

18. The cold chassis of claim 15, wherein the cooling ribs are connected to each other.

19. The cold chassis of claim 15, wherein the recesses are adjacent to one another and substantially parallel with one another in the face of the frame member.

20. The cold chassis of claim 15, wherein each cooling rib further comprises a plurality of microchannels that extend internally along a majority of the length of the cooling rib.

* * * * *